United States Patent [19]

Parker et al.

[11] Patent Number: 6,087,842
[45] Date of Patent: Jul. 11, 2000

[54] INTEGRATED OR INTRAPACKAGE CAPABILITY FOR TESTING ELECTRICAL CONTINUITY BETWEEN AN INTEGRATED CIRCUIT AND OTHER CIRCUITRY

[75] Inventors: Kenneth P. Parker, Fort Collins; John E. McDermid, Loveland, both of Colo.

[73] Assignee: Agilent Technologies, Palo Alto, Calif.

[21] Appl. No.: 08/639,580

[22] Filed: Apr. 29, 1996

[51] Int. Cl.[7] .................................................. G01R 31/04
[52] U.S. Cl. .......................................... 324/763; 324/765
[58] Field of Search .................................. 324/684, 158.1, 324/754, 763, 765, 538

[56] References Cited

U.S. PATENT DOCUMENTS

| | | | |
|---|---|---|---|
| 4,743,841 | 5/1988 | Takeuchi | 324/763 |
| 5,124,660 | 6/1992 | Cilingiroglu | 324/538 |
| 5,130,645 | 7/1992 | Levy | 324/158 |
| 5,254,953 | 10/1993 | Crook et al. | 324/538 |
| 5,391,993 | 2/1995 | Khazam | 324/684 |
| 5,420,500 | 5/1995 | Kerschner | 324/72.5 |
| 5,434,502 | 7/1995 | Walters | 324/158 |
| 5,517,110 | 5/1996 | Soiferman | 324/158.1 |
| 5,570,034 | 10/1996 | Needham | 324/763 |
| 5,631,572 | 5/1997 | Sheen | 324/754 |

FOREIGN PATENT DOCUMENTS

| | | |
|---|---|---|
| 0277764 A2 | 8/1988 | European Pat. Off. . |
| 0492806 A2 | 7/1992 | European Pat. Off. . |
| 0599544 A1 | 6/1994 | European Pat. Off. . |
| WO95/08125 | 3/1995 | WIPO . |

OTHER PUBLICATIONS

Sensors and Actuators; Elsevier Sequoia S.A., Lausanne; vol. 5 (1984); A MOS Hall Device Free From Short–Circuit Effect; R.S. Popovic; pp. 253–262.

Hewlett–Packard Journal; Mar. 1979; Analog In–Circuit Component Measurements: Problems And Solutions; David T. Crook; pp. 19–22.

Primary Examiner—Glenn W. Brown
Attorney, Agent, or Firm—Augustus W. Winfield

[57] ABSTRACT

An electromagnetic probe is integrated within an integrated circuit or mounted within an IC package to provide a capability for testing continuity between the integrated circuit and a substrate to which the integrated circuit is mounted. In a first embodiment, capacitive test probes are integrated within the integrated circuit, underneath bonding pads. In a second embodiment, Hall-effect devices are integrated within the integrated circuit underneath bonding pads. In a third embodiment, an inductive loop is integrated within the integrated circuit underneath bonding pads. In a fourth embodiment, an IC package assembly includes an internal capacitive test probe for electrical continuity testing. An internal shield may also be used as a capacitive test probe. In a fifth embodiment, an IC package assembly includes an inductive loop within the package for electrical continuity testing. The integrated or intrapackage test probes provide electromagnetic coupling to bonding pads or to a lead frame and to bonding wires (if present), to detect whether there is electrical continuity between an integrated circuit bonding pad or lead frame and conductors on an external substrate. The integrated or intrapackage test probes enable continuity testing for direct-bonding with no package, or for a package assembly even if the package assembly includes grounded shielding or a grounded heat sink.

23 Claims, 10 Drawing Sheets

INTEGRATED OR INTRAPACKAGE CAPABILITY FOR TESTING ELECTRICAL CONTINUITY BETWEEN AN INTEGRATED CIRCUIT AND OTHER CIRCUITRY

FIELD OF INVENTION

This invention relates generally to integrated circuit (IC) technology and IC packaging technology, and more specifically to integrating an apparatus within an IC or providing an apparatus within an IC package to facilitate electrical continuity testing.

BACKGROUND OF THE INVENTION

There is an ongoing need for testing electrical continuity between a conductive path on an integrated circuit and a corresponding conductive path on a printed circuit board, or on a ceramic substrate or on some other interconnecting assembly. One common approach to IC functional testing that can include continuity testing is boundary scan testing, in which additional circuitry is added to an IC for serially sending and receiving test information. Boundary scan testing requires additional circuitry, requires power during testing, requires a test to be developed that in turn requires some knowledge of the circuit design, and is primarily intended for digital circuitry. Another approach is to use automated cross-sectional analysis of X-ray images of solder joints. X-ray analysis is unique in that it can provide information on solder joint quality and hidden flaws that might lead to future failures. However, some proposed methods of directly bonding chips to substrates use conductive adhesive instead of solder. Some present X-ray solder joint analyzers have insufficient resolution to reliably image the contact area of direct bonded chips, which is typically much smaller than the contact area of typical through-hole or surface mount packages. In addition, new X-ray imaging techniques may be required since silver based conductive adhesives are typically much more transparent to X-rays than lead based solder.

Of particular interest to the invention are dedicated continuity testers and multipurpose in-circuit testers that provide unpowered continuity testing of loaded printed circuit boards. In one common arrangement for continuity testing, two types of "probes" are used for providing electronic stimulus signals and for measuring electronic responses. The first type of probe makes ohmic contact with conductive surfaces within the electronic assembly. A sharp pointed "nail" is used to penetrate thin insulating coatings and make ohmic contact with a trace or pad on a printed circuit board. The second type of probe does not make an ohmic contact, but instead induces or measures electromagnetic fields near the electronic devices being tested. For example, a capacitive probe may be used to induce a test signal onto an internal lead frame or internal bond wires of an integrated circuit. In this application, the terms "probe" or "test probe" may mean a device for ohmic contact or a device for inducing or measuring an electromagnetic field. An example of a commercially available printed circuit board continuity tester using "bed-of-nails" fixtures and capacitive probes is the 3070 Series II Test System from Hewlett-Packard Company with HP TestJet capacitive probes. An example of the use of capacitive probes for verifying the integrity of connections for integrated circuits may be found in U.S. Pat. No. 5,254,953 (Identification Of Pin-Open Faults By Capacitive Coupling Through The Integrated Circuit Package) issued Oct. 19, 1993 to David T. Crook, Kevin W. Keirn, and Ugur Cilingiroglu (Crook et al). An additional example in which a capacitive probe includes a shield or guard and a buffer circuit may be found in U.S. Pat. No. 5,420,500 (Capacitive Electrode System for Detecting Open Solder Joints in Printed Circuit Assemblies) issued May 30, 1995 to Ronald K. Kerschner (Kerschner).

In order to verify that a conductive path on an integrated circuit is connected to a circuit assembly, a capacitive probe must be able to induce or detect a measurable signal on the conductive path. In the example embodiment disclosed in Crook et al, the capacitance between the capacitive probe and the conductive path for a good connection is typically in the range of 40–200 femtofarads and the capacitance between the capacitive probe and the conductive path for an open connection is typically less than 20 femtofarads. Although a current or voltage may be measured rather than capacitance, these numbers provide an indication of the typical surface area and spacing needed to ensure that an induced signal can be distinguished from noise.

Capacitive probes of the type disclosed in Crook et al are typically used to capacitively couple primarily to the internal lead frame and bonding wires of an IC package. Typically, internal conductive surfaces (lead frame and bonding wires), separated from the capacitive probe by the insulating material in the integrated circuit package, provide sufficient capacitive coupling to ensure a measurable signal. However, some integrated circuit packages may have a heat sink attached. Alternatively, some integrated circuit packages may have an internal conductive shield for reduction of radio frequency interference or temperature control. If a heat sink or internal shield is floating, the heat sink or shield may act as a large series capacitor, and testing may still be performed. However, if a heat sink or internal shield is grounded or connected to a common signal return, the heat sink or shield may interfere with the function of a capacitive probe by partially or completely shielding the internal lead frame and bonding wires.

In general, the capacitance between the lead frame and bonding wire for the lead of interest must be much greater than stray capacitance. For packages having external edge leads, it may be possible to capacitively couple to the external leads. For example, see the Kerschner patent referenced above, and in particular, FIG. 6 of Kerschner and the related discussion in column 7 of Kerschner. However, some IC packages may not have edge leads. For example, some integrated circuit packages use pin-grid arrays or ball-grid arrays on the bottom of the package. In addition, some integrated circuit mounting techniques eliminate the lead frame. For example, gold studs on IC bonding pads may be directly bonded to a substrate with a flexible conductive adhesive. Alternatively, short bonding wires may be used for thermal stress relief. Variations of attaching an IC directly to a substrate are sometimes called "flip-chip" mounting. In general, pin-grid array mounting, ball-grid array mounting, and direct attachment of IC's to a substrate reduce the measurable capacitive signal below the noise level.

There is a need for testing of electrical continuity of integrated circuit conductors for packages that include grounded heat sinks or grounded internal shields and for integrated circuits that are directly bonded to a substrate (without a lead frame).

SUMMARY OF THE INVENTION

In a first embodiment, a capacitive test probe is integrated within an integrated circuit, thereby enabling continuity testing independent of package configuration or substrate mounting. Preferably, a "probe" surface is provided for capacitive coupling to each IC bonding pad. These probe surfaces may be connected together to provide a common electrical access. The probe material may be made highly resistive to reduce cross coupling during normal operation of the IC. It is not necessary for the probe to have a separate contact.

In a second embodiment, Hall-effect devices are integrated within an integrated circuit below each IC bonding pad. These devices are then used to measure current through a bonding pad, with a sensitivity that may be difficult to obtain with external measurements. In addition, Hall-effect devices may provide measurement of specific internal current paths that cannot be separately measured by external measurements. The Hall-effect devices may be connected together in series to provide a common electrical access.

In a third embodiment, an inductive loop probe is integrated within an integrated circuit, with portions of the loop passing serially below each IC bonding pad. The inductive loop is then used to measure current through a bonding pad.

In a fourth embodiment, capacitive probes are mounted internally to or on a surface of an integrated circuit package, thereby enabling continuity testing for packages that have grounded heat sinks or grounded internal shields. A conductive plate serves as a stimulus or measurement probe for signals on leads or bond wires within the integrated circuit package. Shape and location of the capacitive probe may be specifically engineered for a package to provide the desired capacitive coupling. An internal shield may also serve as the capacitive test probe, provided it is not otherwise connected or can be disconnected for testing purposes. The capacitive probe material may be highly resistive. It is not necessary for the capacitive probe to have a separate contact.

In a fifth embodiment, an inductive loop probe is mounted internally to an integrated circuit package, thereby enabling continuity testing for packages that have grounded heat sinks or grounded internal shields. The loop probe serves as a stimulus or measurement probe for current signals on leads or bond wires within the integrated circuit package. Shape and location of the loop probe may be specifically engineered for a package to provide the desired magnetic coupling. A shorted loop probe may also serve as a capacitive test probe, providing an additional measurement.

For any of the embodiments involving a capacitive probe, conductivity of the capacitive probe may be very low, or the probe material may be lossy at high frequencies, to minimize high frequency cross coupling effects through the probe when the IC is operating. For any of the embodiments, electrical access to the test probe may be provided by an IC lead, by an ohmic contact somewhere on the package (or IC substrate if there is no package) or external circuitry may couple to the probe capacitively or magnetically (capacitively to a capacitive probe or magnetically to a loop probe).

DETAILED DESCRIPTION OF THE PREFERRED EMBODIMENT OF THE INVENTION

Figure 1:
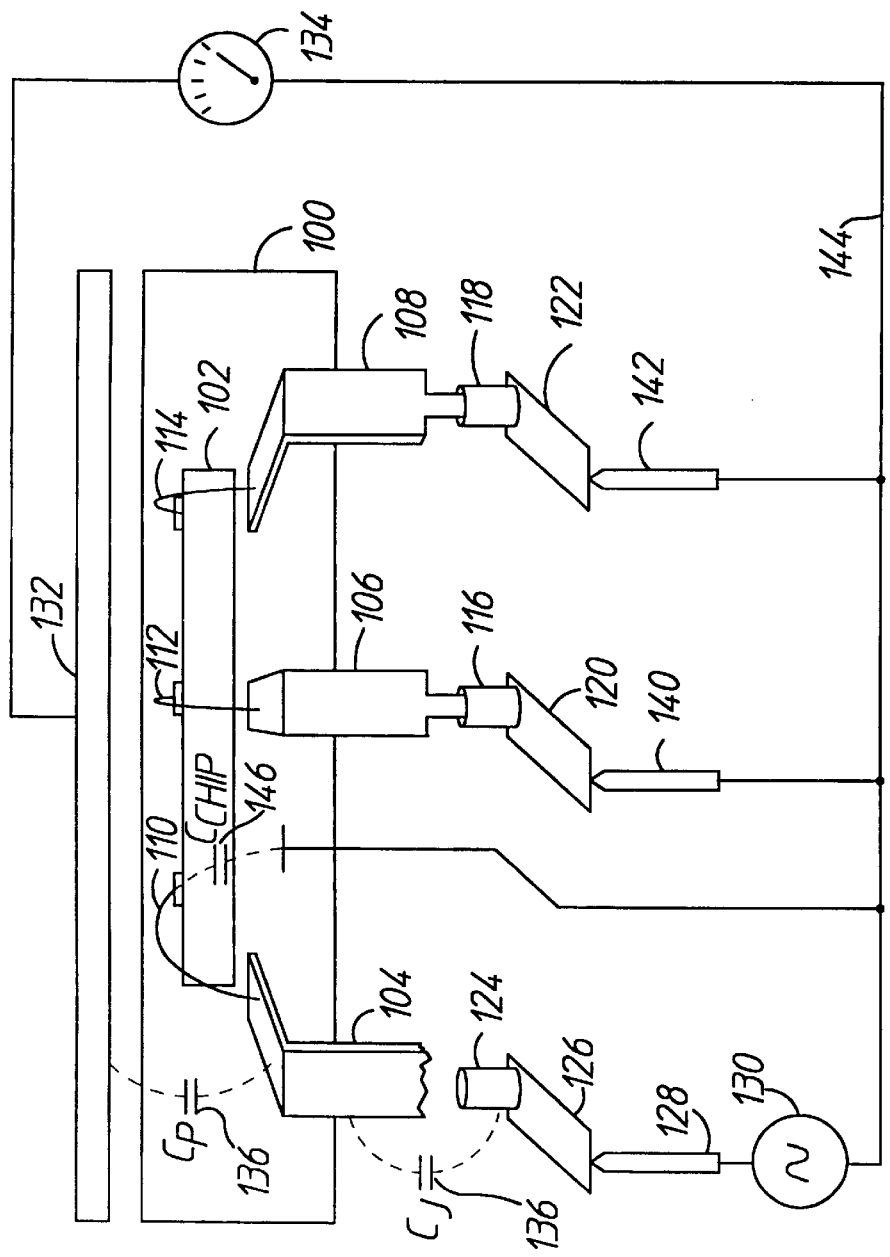
FIG. 1 (prior art) is a block diagram schematic illustrating a capacitive probe and associated circuitry for continuity detection.

In prior art FIG. 1, an integrated circuit (IC) package 100 contains an IC 102. External leads (104, 106 and 108) are connected to bonding pads on the IC by wire bonds (110, 112, 114). Leads 106 and 108 pass through solder filled vias (116, 118) in a printed circuit board to traces (120, 122) on the bottom side of the printed circuit board. Lead 104 is supposed to pass through a solder filled via 124 to a trace 126 but lead 104 is broken or not soldered. Trace 126 is being driven by an AC signal source 130 through a bed-of-nails ohmic test probe 128. A capacitive test probe 132 is placed on the top of the integrated circuit package 100. A thin dielectric (not illustrated) may be placed between the package 100 and the capacitive probe 132. The capacitive test probe 132 is connected to a measuring device 134, such as an ammeter, a voltmeter, or measurement circuitry for acquiring parameters for computing an effective capacitance. The AC stimulus 130 is typically an AC voltage, typically about 200 millivolts and typically at a frequency of about 8 kilohertz. Capacitive coupling ($C_P$, 136) between the capacitive probe 132 and an internal lead frame (the internal portion of lead 104) and bonding wire 110 results in an induced signal (current or voltage) on the capacitive probe 132. If the solder joint for lead 104 is intact, the signal measured by device 134 will exceed a predetermined threshold. If the solder joint for lead 104 is not intact, the small signal on probe 134 will not exceed the predetermined threshold.

In general, each lead, each bonding wire, and each bonding pad has parasitic impedance paths to ground and to adjacent leads resulting in currents that may affect the current of interest. Since the signal being measured is extremely small, the effects of alternative current paths must be reduced as much as possible. One technique to reduce the effects of alternative paths is to ensure that both ends of a alternative path are at the same voltage, so that no current flows through the alternative path. This is a common technique in analog in-circuit testing. For general background on the technique, see Crook, David T., "Analog In-Circuit Component Measurements: Problems and Solutions", *Hewlett-Packard Journal*, March, 1979, pp 19–22. In the system illustrated in FIG. 1, a suitable technique is to ground all device leads not directly involved in the continuity measurement (or connect the unused leads to a common signal return). Note in FIG. 1 that leads 106 and 108 are connected to ground (or in general, a common signal return 144) through additional ohmic test probes (140, 142).

The signal source 130 and the measurement device 134 may be interchanged, so that the signal source 130 drives the capacitive probe 132 and the measurement device 134 measures a signal coupled to the lead 104 (see, for example, Crook et al). In the configuration illustrated in FIG. 1, where the capacitive probe receives a signal from a driven lead, amplifier circuitry is preferably mounted directly onto the probe 132 to increase the signal-to-noise ratio and to reduce the effects of stray capacitance (see, for example, Kerschner).

Note also in FIG. 1 that if lead 104 is broken or unsoldered, there is an effective capacitance between lead 104 and trace 126 (and via 124), depicted as $C_J$ (138). In addition, there is an effective capacitance between lead 104 (and lead frame and bonding wire 110) and the common signal return 144, depicted in FIG. 1 as $C_{CHIP}$ (146). $C_{CHIP}$ (146) is typically dominated by structures in the IC 102 but also includes various stray capacitances. In general, there may be many capacitive paths between bonding wire 110 and the common signal return 144 through the IC 102.

Figure 2A:
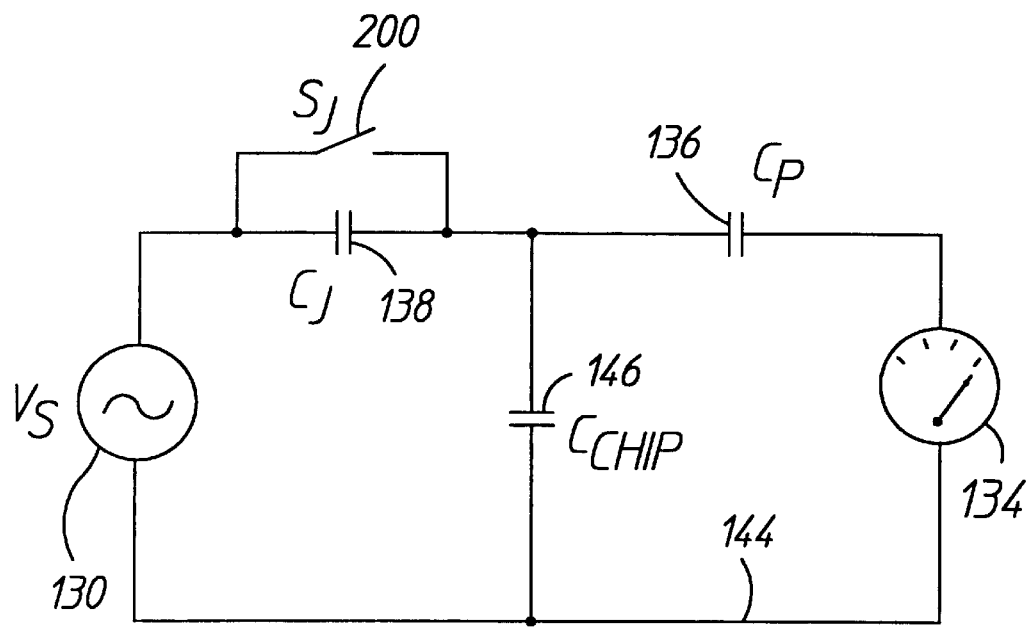
FIG. 2A (prior art) is a simplified schematic of the capacitive probe circuit of FIG. 1.

FIG. 2A illustrates a simplified equivalent circuit for the continuity measurement system of FIG. 1. In FIG. 2A, a solder joint to be tested is depicted as a switch 200 in parallel with a capacitance $C_J$ (138). If the solder joint is good, switch 200 is closed. If the solder joint is open, switch 200 is open and $C_J$ (138) is the capacitance of the open solder joint. As in FIG. 1, $C_{CHIP}$ (146) is the overall capacitance from the lead (and bonding wire) under test to the common signal return 144. As in FIG. 1, $C_P$ (136) is the capacitance formed by the capacitive probe 132 in conjunction with the lead (and lead frame and bonding wire) under test.

If the solder joint under test is good (switch 200 is closed), the voltage across $C_{CHIP}$ (146) is the same as stimulus 130. If the solder joint under test is open (switch 200 is open), the stimulus voltage is divided by $C_J$ (138) in series with the combination of $C_{CHIP}$ (146), and $C_P$ (136). In general, although $C_{CHIP}$ (146) is uncharacterized, $C_{CHIP}$ (146) is typically much larger than $C_P$ (136) which in turn is typically much larger than $C_J$ (138). Typically, $C_{CHIP}$ (146) is on the order of 10 picofarads, $C_P$ (136) is on the order of 100 femtofarads, and $C_J$ (138) is less than 20 femtofarads. Assuming that measuring device 134 is an ammeter, with an open solder joint (switch 200 open), the current measured by device 134 is reduced first due to the increased series impedance of $C_J$ (138) and second due to the substantial attenuation of the voltage from the stimulus 130 by the chip capacitance $C_{CHIP}$ (146).

Figure 2B:
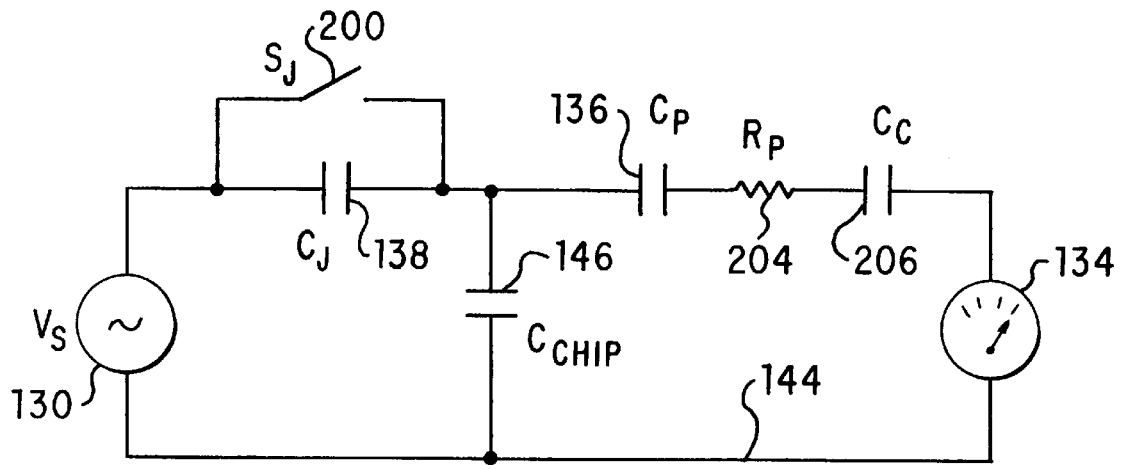
FIG. 2B is the schematic of FIG. 2A with additional impedances to illustrate the relative importance of optional impedances.

In FIG. 1, the measurement device 134 is depicted as making an ohmic contact to the capacitive probe 132. Alternatively, the capacitive probe 132 may be capacitively coupled to the measurement device (or stimulus if the configuration is reversed). In addition, it is not necessary for the capacitive probe 132 to be highly conductive. The sheet resistance of the capacitive probe 132 can be very high. Each of these points are illustrated first in FIG. 2B, and then the importance will be discussed further in conjunction with various alternative embodiments. FIG. 2B is circuit of FIG. 2A with two additional components, $C_C$ (206) and $R_P$ (204). $C_C$ (206) represents capacitive coupling of the capacitive probe 132. $R_P$ (204) may be a discrete resistance as depicted in FIG. 2B or $R_P$ (204) may the sheet resistance of the capacitive probe 132. If $C_C$ (206) is much greater than $C_P$ (136), then $C_C$ (206) has little effect on the current measured by device 134. Similarly, if the impedance of $R_P$ (204) is much less than the impedance of $C_P$ (136) at the test frequency, then $R_P$ (204) has little effect on the current measured by device 134. Again, the importance of $C_C$ (206) and $R_P$ (204) will be discussed further in the discussion of various embodiments of the invention.

Figure 2C:
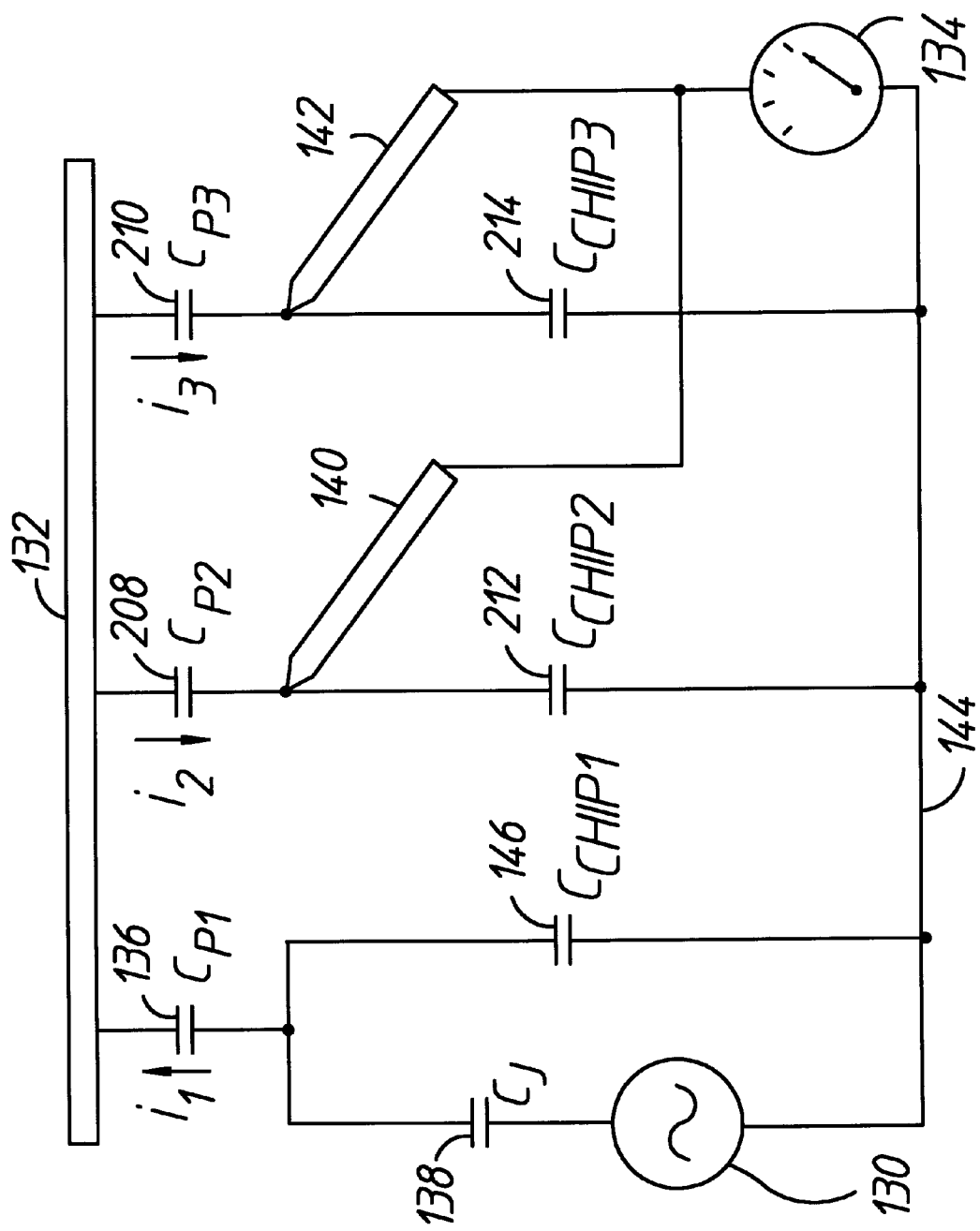
FIG. 2C is a variation of the schematic of FIG. 2A with additional capacitive coupling to the probe provided through IC leads other than the lead under test, instead of a separate coupling to the probe.

It is not necessary for the capacitive probe 132 to have a separate connection. It is possible to make a continuity measurement where the measured current flows through all the leads other than the lead under test. That is, instead of connecting the measurement device 134 to the capacitive probe as in FIG. 1 and FIG. 2A, the measurement device may be placed so that current through the capacitive probe flows through all the test probes other than the test probe for the lead under test. This is illustrated in FIG. 2C. In FIG. 2C, $C_{P1}$ (136) is the same as $C_P$ (136) in FIG. 1, and $C_{P2}$ (208) and $CP_{P3}$ (210) represent the corresponding capacitances for leads 106 and 108 respectively. In FIG. 2C, $C_{CHIP1}$ (146) is the same as $C_{CHIP}$ (146) in FIG. 1, and $C_{CHIP2}$ (212) and $C_{CHIP3}$ (214) are the corresponding capacitances for leads 106 and 108 respectively. In the embodiment in FIG. 2C, assuming that the measuring device 134 measures current, the measuring device 134 is connected so that current through probes 140 and 142 flows through the measuring device 134. Referring back to FIG. 1 and FIG. 2A, with $C_{P2}$ and $C_{P3}$ included, if device 134 is a current measuring device with a much lower impedance than the parallel combined impedance of $C_{P2}$ and $C_{P3}$, then essentially all the current through $C_{P1}$ flows through the measuring device 134. As will be discussed below in conjunction with further discussion of FIG. 2B, the impedance of $C_P$ at a typical measurement frequency is typically on the order of 100 megohms. Similarly, in FIG. 2C, if the impedance of device 134 is much smaller than the impedance of $C_{CHIP2}$ (212) and $C_{CHIP3}$ (214), then very little current flows through $C_{CHIP2}$ (212) and $C_{CHIP3}$ (214). Therefore, device 134 measures the aggregate of currents $i_2$ and $i_3$, the aggregate consisting of current $i_1$ though $C_{P1}$ (136), which is essentially the same as the current measured in the embodiment illustrated in FIG. 1 and FIG. 2A.

In general, continuity testing as depicted in FIGS. 1, 2A, 2B and 2C is performed with the circuit board powered off, and a capacitive probe 132 is removed during normal operation of the circuit board. However, in the embodiments of the invention using capacitive probes as discussed below, the capacitive probe may be present during normal operation of the integrated circuit. Therefore, there may be a need to reduce high frequency cross talk between IC leads (through the capacitive probe) during normal operation of the integrated circuit. Note that IC's typically have greater than 1 picofarad capacitance between leads, and the probe capacitance (FIG. 1, $C_P$) is typically on the order of 0.1 picofarad (100 femtofarads), so that even if the probe is left in place during normal operation of the IC, probe capacitance typically does not have a substantial effect on crosstalk. However, if necessary in special circumstances, high frequency cross talk through a capacitive probe may be reduced by making the sheet resistance of the probe high or by fabricating a high resistance between segments of the probe. In FIG. 2B, $R_P$ (204) is the resistance of the capacitive probe. If $C_P$=200 femtofarads with a test frequency of 8 kilohertz, the impedance of $C_P$ is about 100 megohms during testing. Therefore, the resistance $R_P$ (204) of the capacitive probe can be as large as 10 megohms and still enable continuity measurement. For high frequencies during normal operation, the impedance of $C_P$ decreases and $R_P$ (204) then dominates the effective impedance for high frequency cross talk between leads through the probe.

Referring to FIG. 1, if the integrated circuit package 100 has an attached (and grounded) heat sink, the heat sink may interfere with the capacitive coupling between the capacitive probe 132 and the lead frame (and bonding wires) internal to the integrated circuit package 100. Likewise, if the integrated circuit package 100 has a grounded internal shield between the capacitive probe 132 and the lead frame (and bonding wires), the shield may interfere with the capacitive coupling between the capacitive probe 132 and the lead frame (and bonding wires) internal to the integrated circuit package 100.

Figure 3A:
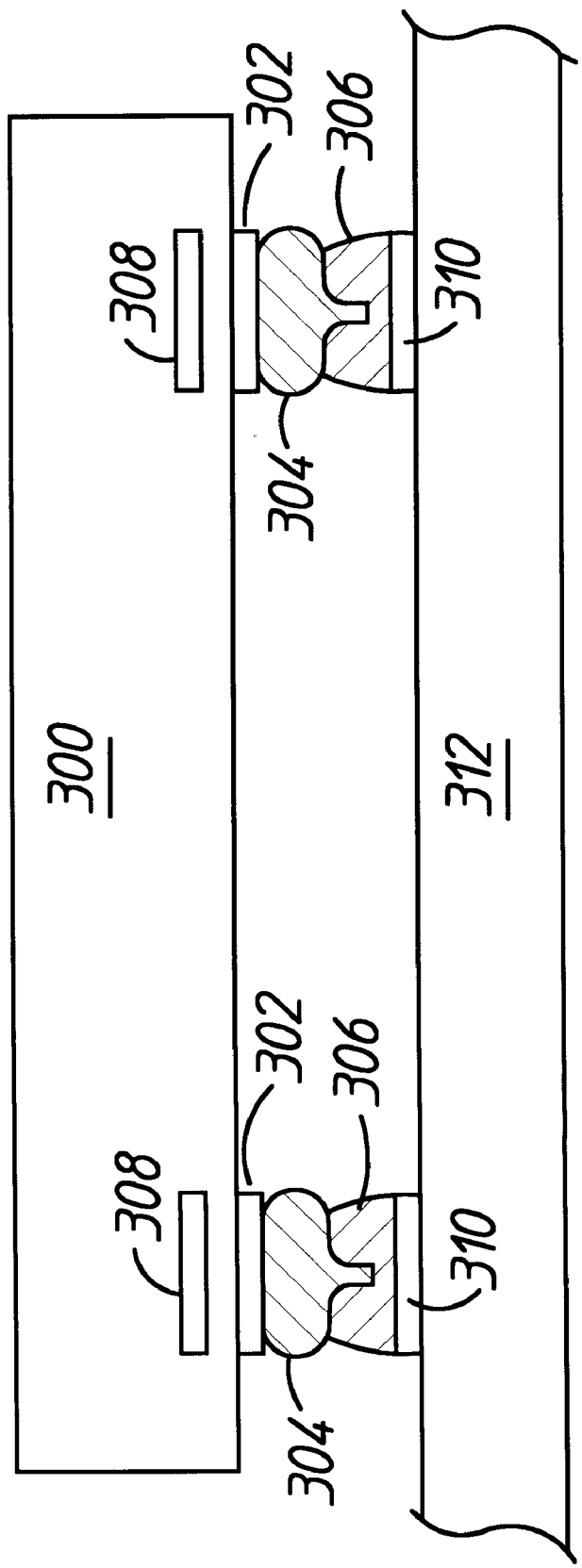
FIG. 3A is a cross-section view of an integrated circuit directly bonded to a substrate with an integrated capacitive probe apparatus.

FIG. 3A illustrates a first embodiment of the invention. An integrated circuit 300 is mounted directly to a substrate 312, with no lead frame. Integrated circuit 300 has bonding pads 302. Gold wire bonds 304 are trimmed short. A flexible conductive adhesive 306 is used to bond the gold wire bonds 304 to substrate pads 310 on the substrate 312. The particular bonding technique depicted in FIG. 3A is not relevant to the invention, but is merely used for illustration of flip-chip bonding or other direct chip to substrate bonding. With direct bonding as illustrated, a capacitive probe as illustrated in FIG. 1 is ineffective. To enable testing, in the first embodiment of the invention, internal conductive pads 308 are integrated as part of IC 300 for use as capacitive test probes for testing the continuity between bonding pads 302 and traces on the substrate 312.

Typically, an integrated circuit may have multiple metalization layers, separated by electrical insulating layers, with the outside metalization layer providing the bonding pads. Often, there is no active circuitry immediately underneath the bonding pads or if there is circuitry, it is insulated from the bonding pads. Therefore, internal pads 308 may typically be added with no loss of active circuit area.

Figure 3B:
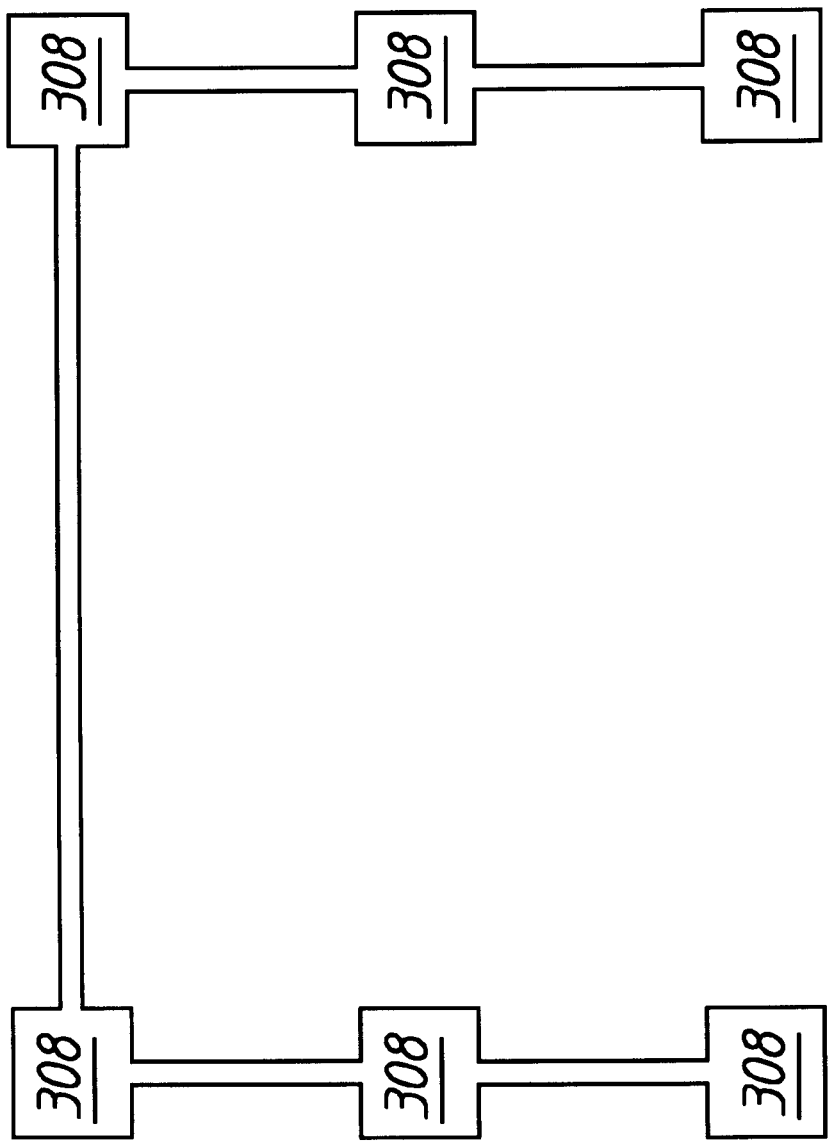
FIG. 3B is a plan view of the capacitive probe of FIG. 3A.

FIG. 3B illustrates multiple internal pads 308 electrically interconnected with each other but interconnection is not necessary as long as coupling (ohmic or capacitive) to the test circuitry can be made. It is not necessary for the interconnections or the internal pads 308 to be in one layer. It is not be necessary for internal pads 308 to be conductively interconnected (capacitive coupling between internal pads may be sufficient). As illustrated in FIG. 33, if the internal pads 308 are interconnected, no separate coupling between the test circuitry and the internal pads 308 is required. Therefore, no ohmic connection is required between the probes 308 and the test circuitry. In particular, there is no need to dedicate a bonding pad for continuity test. However, if the integrated circuit 300 has boundary scan logic included, one of the bonding pads dedicated to powered boundary scan testing may also be used to provide an ohmic connection to the internal pads 308 for unpowered capacitive continuity testing. Alternatively, internal pads 308 may have a separate ohmic or capacitive coupling to the surface of the integrated circuit 300 to enable driving or sensing.

The internal pads 308 may be made of a highly resistive material to reduce high frequency cross talk between bonding pads 302 (through the interconnected internal pads 308) during normal operation of IC 300. An example of a suitable material with relatively high sheet resistance is nickel-chromium, a material commonly used for manufacturing electrolytic capacitors. Another suitable material is tungsten, commonly used for metalization in integrated circuits. Alternatively, for even higher resistance, semiconductor resistors may be fabricated between the internal pads 308, using any of the common fabrication techniques for semiconductor resistors, for example, diffused resistors, pinched resistors, epitaxial resistors, or ion-implanted resistors. As still another alternative, the internal pads 308 may be connected by fusible links and the fuses can be blown after testing is complete.

Integrated capacitive probes as illustrated in FIGS. 3A and 3B have the advantage of enabling a continuity test even though the IC being tested is unpowered. An alternative for testing a powered IC is to integrate magnetic sensing probes below the bonding pads. Integrated Hall-effect devices may be used to sense a field resulting from current flowing through the bonding pads or current through traces leading to bonding pads. For an example of a sensitive integrated Hall-effect sensor that is also simple to integrate, see Popovic, R. S., "A MOS Hall Device Free From Short-Circuit Effect," *Sensors and Actuators*, Vol. 5 (1984) pp 253–262. Devices as disclosed by Popovic can be made very sensitive with negligible effect on the impedance at a bonding pad.

Figure 4A:
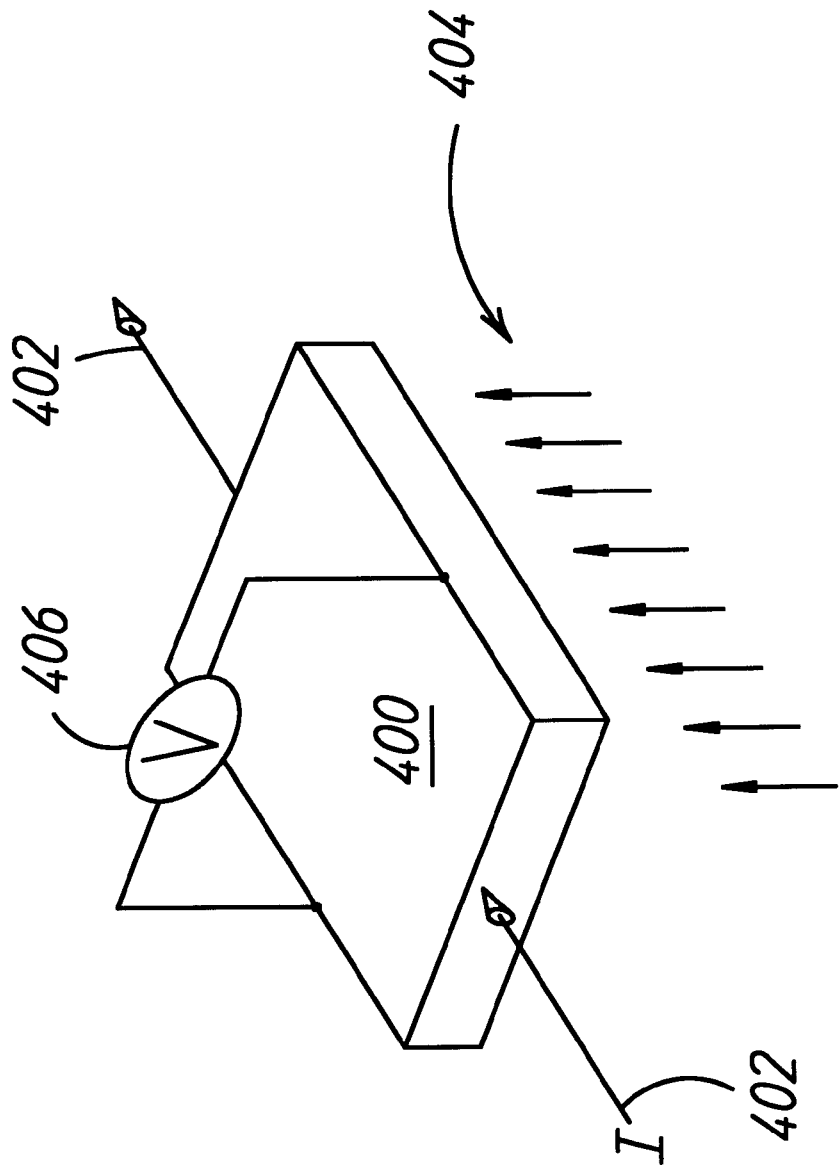
FIG. 4A is a simplified perspective view of a Hall-effect device.

FIG. 4A illustrates a Hall-effect device 400. Current 402 flows through one edge and through the opposite edge. A magnetic B-field 404 flows through the device in a direction transverse to current flow. A voltage 406 is measured across edges transverse to both current flow and B-field direction.

Figure 4B:
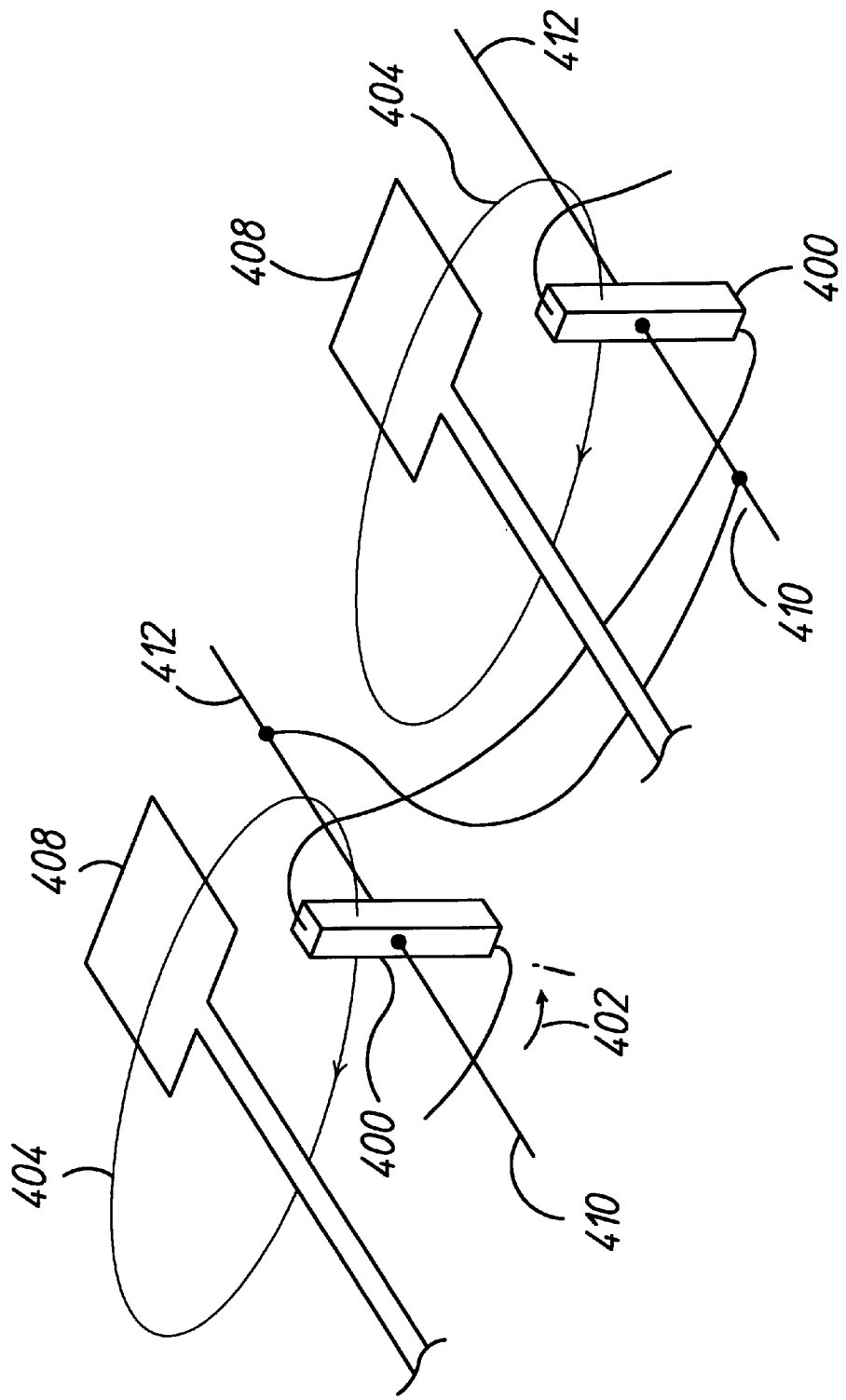
FIG. 4B is a cross-section view of an integrated circuit with an integrated Hall-effect device.

In FIG. 4B, two bonding pads 408 each have a Hall-effect device 400 integrated below the bonding pad. Each Hall-effect device 400 can be positioned to measure only one specific path leading to a bonding pad. Current through paths to bonding pads results in B-fields 404. Current 402 flows through all the Hall-effect devices 400. Each Hall-effect device has two leads 410 and 412 for measuring voltage. All the Hall-effect devices 400 can be connected together in series, so that if any Hall-effect device 400 generates a voltage, the voltage can be measured across the outermost series leads. The voltage measuring leads can be directly coupled to the outside (for example through unused IC leads). Alternatively, if boundary scan is implemented, an on-chip analog-to-digital converter can be used to measure the voltage and the resulting digital value can be stored and serially retrieved along with other boundary scan data.

Figure 5:
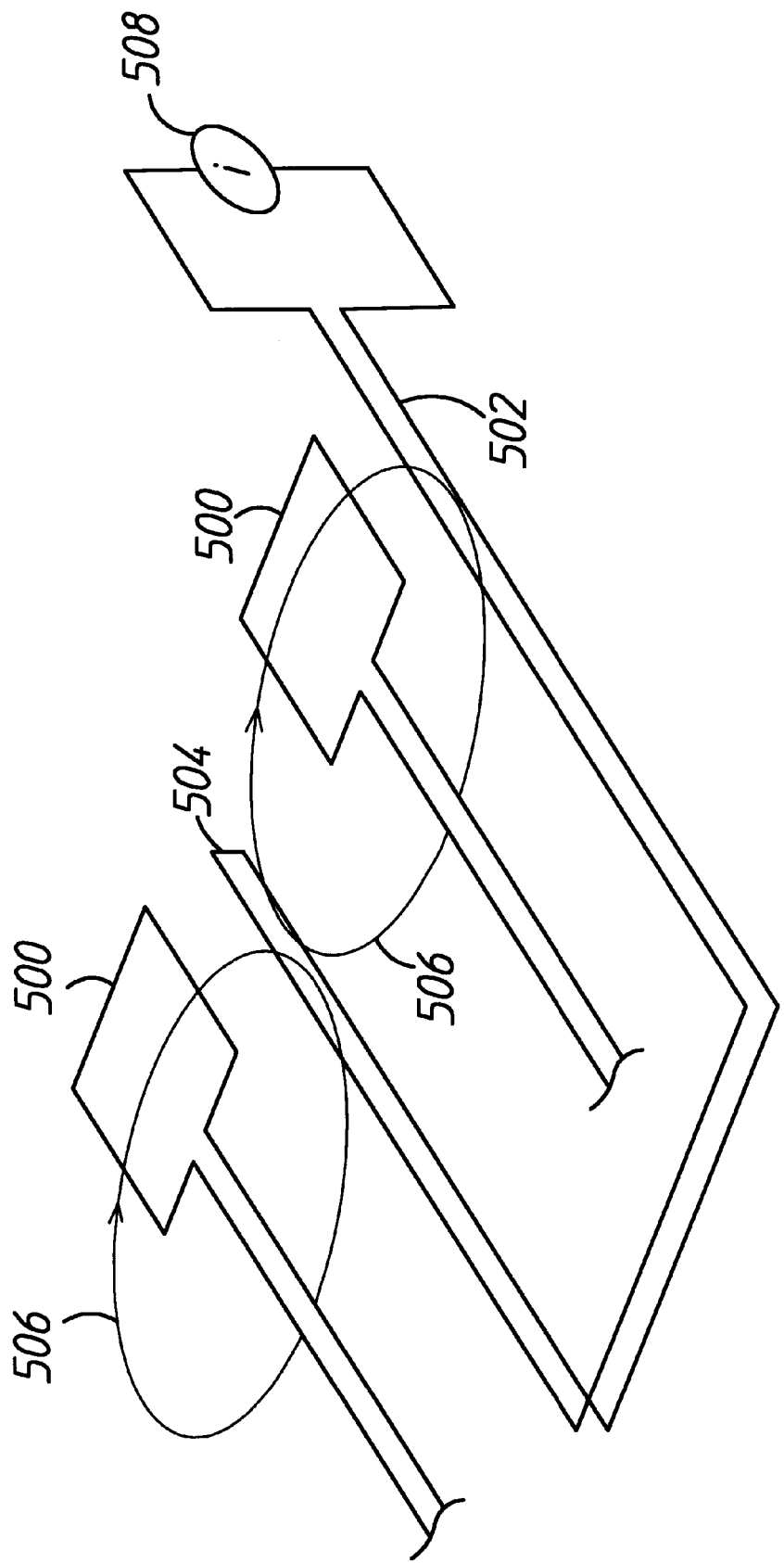
FIG. 5 is a perspective view of an integrated circuit with an integrated loop probe.

FIG. 5 illustrates an alternative probe for measuring current through bonding pads. In FIG. 5, current through either of two IC bonding pads 500 generates a magnetic B-field 506. The field 506 intersects a conductive loop 502 (note the loop is closed at the end 504), that is integrated below each bonding pad 500, inducing a current in the loop 502 that is measured by ammeter 508. Loop 502 is fabricated as part of various metalization layers for the integrated circuit.

Figure 6A:
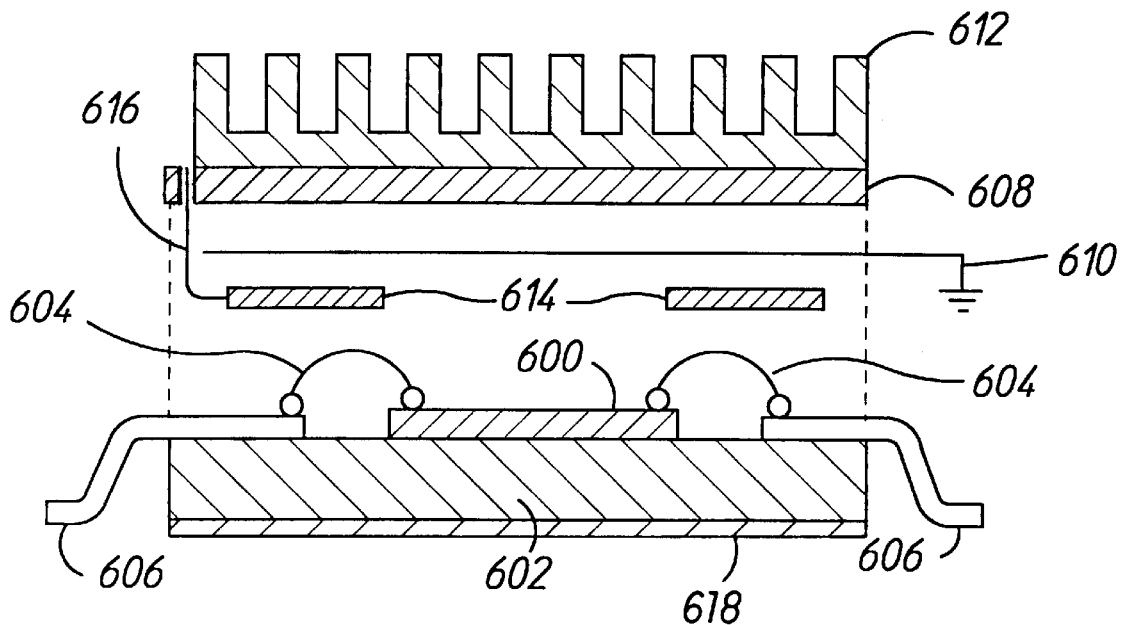
FIG. 6A is a cross-section exploded view of an integrated circuit package assembly with a capacitive probe mounted within the package.
Figure 6B:
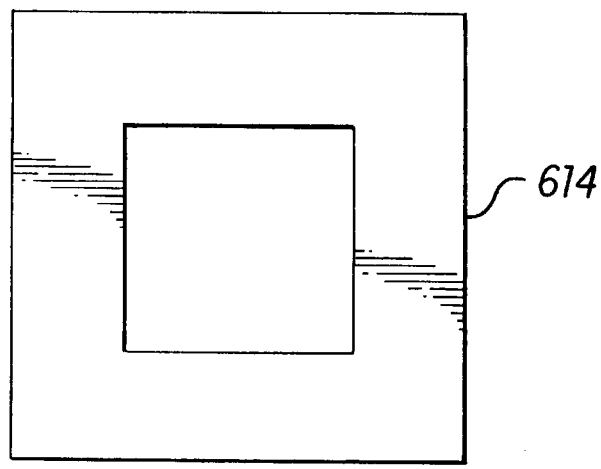
FIG. 6B is a plan view of the capacitive probe of FIG. 6A.

Integrated probes such as capacitive probes 308 (FIGS. 3A and 3B), Hall-effect probes 400 (FIGS. 4A and 4B) and conductive loop 502 (FIG. 5) are a preferred solution to the continuity testing problem because integrated probes are independent of package design and work even when there is no package (for example, direct bonding as in FIG. 3A). However, adding probes to an integrated circuit may not always be practical, cost effective or desirable. FIG. 6A illustrates an integrated circuit package assembly modified in accordance with a fourth embodiment of the invention, in which a capacitive probe is placed inside an IC package. In FIG. 6A, an integrated circuit die 600 is attached to a substrate or base 602. The die 600 is electrically attached to bond wires 604 that in turn are attached to leads 606. The leads 606 are part of a lead frame that extends into the interior of the package. In FIG. 6A, the package is depicted as having a separate cover 608. In general, packages may not have a separate cover but that is not important to the invention. The package assembly may include a grounded shield 610 or a heat sink 612. In the embodiment illustrated in FIG. 6A, a capacitive probe 614 is included inside the package assembly. FIG. 6B illustrates a plan view of the probe 614. The probe 614 as depicted in FIGS. 6A and 6B is a ring or rectangular stripe, near but not touching the bond wires 604 and/or the lead frame. Preferably, the probe 614 does not extend above or below the die 600, thereby avoiding extraneous alternative current paths thorough the die 600 during continuity testing, but this is not a requirement.

The probe 614 may have separate external electrical coupling (ohmic or capacitive) for either a signal source or measurement circuitry (as in FIG. 2A) or the probe 614 may be used as illustrated in FIG. 2C. In FIG. 6A, an external ohmic connection 616 is depicted as passing through the cover 608. If a heat sink is present the heat sink must provide access to connection 616. In FIG. 6A, the heat sink as depicted does not cover the connection 616 but a simple hole through the heat sink would also be acceptable. The external connection 616 may alternatively be connected to an unused integrated circuit lead 606. Alternatively, it may pass through the substrate or base 602, with a hole in the printed circuit board to provide access for a nail probe. An external ohmic connection may be a conductive target anywhere on the package that can be probed, preferably on the top or the bottom to accommodate bed-of-nails fixtures. Alternatively, an external probe may be used to capacitively couple to an internal probe 614 (FIG. 2B, $C_C$) as long as the internal probe 614 provides a sufficient surface area that is not covered by a heatsink or shield and is accessible by the external probe. The only requirement is external electrical coupling to the probe 614. If there is an internal conductive shield 610 and grounding for the shield can be broken during continuity testing, the shield may be used as a capacitive probe. When used for continuity testing, the external ground may be temporarily removed and the shield connected to either a signal source or measurement circuitry for use as a probe. Alternatively, a floating shield may function as a probe as illustrated in FIG. 2C.

FIG. 6A illustrates bond wires separate from a lead frame. In some packaging technologies, the bond wires may be eliminated, the die being directly attached to a flex circuit or tape. In these packages, there may still be a lead frame or equivalent structure. That is, each lead may extend inside a package where capacitive coupling can occur between the lead and a capacitive probe.

Again, as discussed in conjunction with FIG. 2B, probe 614 may be highly resistive to help reduce high frequency crosstalk through the probe 614 during normal operation of the integrated circuit. It is not necessary for probe 614 to be metal. There are conductive polymers available that provide suitable sheet resistance. Alternatively, probe 614 may be applied as a thin film, or as a thick film or conductive paint. In general, an internal shield may be placed relatively far away from an IC to avoid high frequency cross talk. The sheet resistance of the shield can be increased if necessary to enable closer placement for capacitive testing.

The package/probe configuration illustrated in FIG. 6A is only one example. In general, there is an extensive variety of IC package configurations, with variations in chip orientation, multiple layers of bonding, combinations of heat sinks and shields, structure for high frequency transmission lines, and so forth. In general, no one probe design will work for all packages and the probe will have to be suitably engineered for each package type. The capacitive test probe may be placed between the lead frame and a base or between bonding wires and the integrated circuit, with suitable insulation or shielding if necessary. Some packages have the IC inverted with bond wires near the package side facing the printed circuit board. For these inverted configurations, or for any other configuration, the capacitive test probe may be placed on the outside surface of the base of the package (for example, FIG. 6A, 618). Holes for a pin grid array or ball grid array may be provided if necessary. A shield may be provided for the probe to reduce coupling to traces underneath the package during testing. Multi-chip modules contain multiple integrated circuits and may also have multiple passive devices. For these packages, multiple probes may be required, and the probes may or may not be interconnected. For these multi-chip packages, capacitive probes may be used to test continuity within the package, or between the package and the substrate to which the package is mounted.

For some devices, ohmic contact may be suitable for continuity testing. For example, a highly resistive conductive epoxy or conductive paint may be painted over an entire lead frame, providing an ohmic (although highly resistive) contact to all internal leads with a resistance that is less than the resistance of a defective solder joint but with a resistance that is sufficiently high to prevent interference with normal operation.

Figure 7:
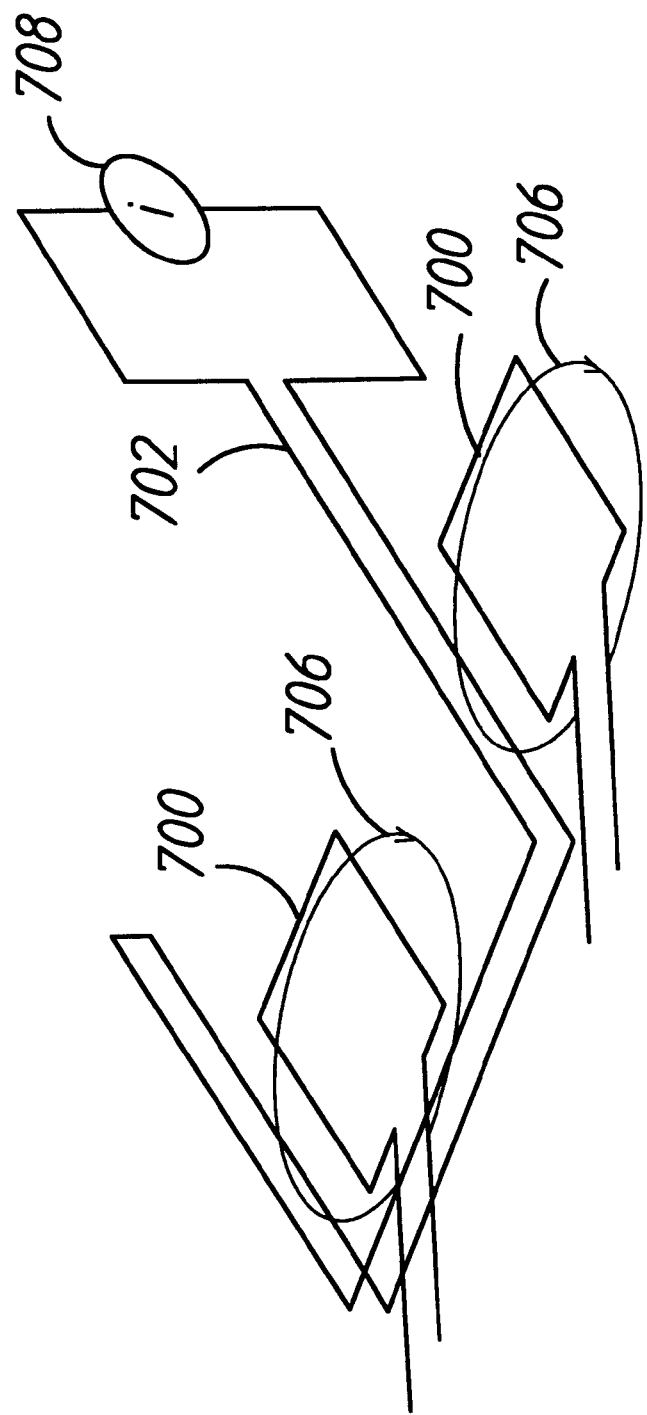
FIG. 7 is a perspective view of an integrated circuit package with a loop probe mounted within the package.

FIG. 7 illustrates an alternative intrapackage probe. In FIG. 7, a loop 702 is implemented within an IC package, similar to the arrangement of FIG. 5 but with the loop in the package rather than integrated. In FIG. 7, current through either of two bonding pads 700 generates a B-field 706. The B-field 706 intersects a conductive loop 702, inducing a current in the conductive loop 702 measured by an ammeter 708. As in FIG. 5, if the loop 702 is shorted, it may alternatively serve as a capacitive probe for an alternative measurement. In general, no one loop 702 will be appropriate for all IC packages so that the path of loop 702 may have to be engineered for each package type.

In summary, integrated capacitive probes (FIGS. 3A and 3B, 308), integrated Hall-effect probes (FIGS. 4A and 4B, 400), integrated conductive loops (FIG. 5, 502) enable continuity testing with direct bonding and no package. Intrapackage capacitive probes (FIGS. 6A and 6B, 614) and intrapackage conductive loops (FIG. 7, 702) enable continuity testing of an integrated circuit package assembly even if there is a grounded internal shield or grounded heat sink. Integrated and intrapackage probes may be physically closer to the bond wires and internal lead structures or physically closer to bonding pads than an external probe as in FIG. 1, 132. Therefore, the signal noise ratio for an integrated or intrapackage probe may be substantially better than the signal to noise ratio for an external probe, even if the surface area is substantially less.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit comprising:

a bonding pad; and a test probe integrated within the integrated circuit, the test probe positioned to enable magnetic but not ohmic coupling between the test probe and the bonding pad, the test probe adapted for electrical coupling to the integrated circuit, thereby enabling a signal, generated externally of the integrated circuit, to be coupled between the bonding pad and the test probe when no power is being applied to operate the integrated circuit for evaluating electrical continuity of the bonding pad.

2. The integrated circuit of claim 1, wherein the test probe comprises a Hall-effect device.

3. The integrated circuit of claim 1, wherein the test probe comprises a conductive loop.

4. The integrated circuit of claim 1, wherein the test probe comprises a capacitive probe positioned to enable capacitive coupling between the test probe and the bonding pad.

5. The integrated circuit of claim 1, wherein the test probe comprises a magnetic probe positioned to enable magnetic coupling between the test probe and the bonding pad.

6. The integrated circuit of claim 1, wherein the test probe is oriented beneath the bonding pad such that loss of active circuit area of the integrated circuit due to placement of the test probe is prevented.

7. A package for an integrated circuit, the package comprising:
   a lead conductively attached to the integrated circuit; and
   a test probe located interior to the package and external to the integrated circuit, the test probe not making ohmic contact with the lead, the test probe positioned to enable electromagnetic coupling between the test probe and the lead, the test probe configured such that the electromagnetic coupling is minimized between the test probe and circuitry within the integrated circuit other than the lead, the test probe further configured to be electrically coupled externally of the package, thereby enabling a signal, generated externally of the package, to be coupled to the lead through the test probe.

8. The package of claim 7, wherein the test probe comprises a capacitive test probe positioned to enable capacitive coupling between the capacitive test probe and the lead.

9. The package of claim 8, wherein the integrated circuit is mounted onto a base, and wherein the capacitive test probe is disposed between the lead and the base.

10. The package of claim 8, wherein the capacitive test probe is configured such that the capacitive test probe does not extend over the integrated circuit, thereby minimizing capacitive coupling between the test probe and the integrated circuit.

11. The package of claim 7, wherein the test probe is adapted for sensing a magnetic field and the test probe is positioned to enable magnetic coupling between the test probe and the lead.

12. The package of claim 11, wherein the test probe comprises a conductive loop.

13. The package of claim 7, further comprising a ground shield located interior to the package and external to the integrated circuit, the ground shield being configured to reduce radio frequency interference of the integrated circuit, and wherein the test probe is disposed between the lead and the ground shield.

14. The package of claim 7, further comprising a heat sink located interior to the package and external to the integrated circuit, the heat sink being configured to assist in temperature control of the integrated circuit, and wherein the test probe is disposed between the lead and the heat sink.

15. The package of claim 14, wherein the means for externally electrically coupling is a hole formed through the heat sink.

16. The package of claim 7, wherein the test probe is configured as a conductive shield which is adaptable between a grounding configuration and a testing configuration, in the grounding configuration the test probe being grounded such that the test probe reduces radio frequency interference of the integrated circuit, and in the testing configuration the test probe being configured as a capacative probe for receiving the externally generated signal.

17. The package of claim 16, further comprising means for externally electrically coupling the signal to the test probe.

18. A method for evaluating electrical continuity of a bonding pad of an integrated circuit comprising the steps of:
   providing an integrated circuit having a bonding pad;
   providing a test probe;
   positioning the test probe within the integrated circuit such that the test probe is positioned to enable magnetic but not ohmic coupling with the bonding pad, the test probe being adapted for electrical coupling to the integrated circuit;
   generating a signal externally of the integrated circuit;
   applying the signal to the test probe;
   coupling the bonding pad and the test probe when no power is being applied to operate the integrated circuit; and
   evaluating a response to the signal.

19. The method of claim 18, wherein the step of positioning the test probe comprises positioning the test probe beneath the bonding pad such that loss of active circuit area of the integrated circuit due to placement of the test probe is prevented.

20. A method for evaluating electrical continuity of a lead of an integrated circuit, the integrated circuit being provided within a package, the method comprising the steps of:
   providing a package having an integrated circuit therein, the integrated circuit having a lead conductively attached to the integrated circuit;
   providing a test probe;
   positioning the test probe interior to the package and external to the integrated circuit such that the test probe does not make ohmic contact with the lead, while being positioned to enable electromagnetic coupling between the test probe and the lead, the test probe being configured such that the electromagnetic coupling is minimized between the test probe and circuitry within the integrated circuit other than the lead;
   electrically coupling the test probe externally of the package;
   generating a signal externally of the package;
   coupling the signal to the lead through the test probe; and
   evaluating a response to the signal.

21. The method of claim 20, wherein the step of providing a package comprises providing a ground shield located interior to the package and external to the integrated circuit, the ground shield being configured to reduce radio frequency interference of the integrated circuit, and wherein the step of positioning the test probe comprises disposing the test probe between the lead and the ground shield.

22. The method of claim 20, wherein the step of providing a package comprises providing a heat sink located interior to the package and external to the integrated circuit, the heat sink being configured to assist in temperature control of the integrated circuit, and wherein the step of positioning the test probe comprises disposing the test probe between the lead and the heat sink.

23. The method of claim 20, wherein the step of providing a test probe comprises the step of providing a test probe configured as a conductive shield, the test probe being adaptable between a grounding configuration and a testing configuration, in the grounding configuration the test probe being grounded such that the test probe reduces radio frequency interference of the integrated circuit, and in the testing configuration the test probe being configured as a capacative probe for receiving the externally generated signal.

* * * * *